(12) United States Patent
Siu

(10) Patent No.: US 9,860,974 B2
(45) Date of Patent: Jan. 2, 2018

(54) SYSTEMS AND APPARATUS FOR CONTROLLING ELECTROSTATIC DISCHARGE ON ELECTRONIC CIRCUIT BOARD

(71) Applicant: PANASONIC AVIONICS CORPORATION, Lake Forest, CA (US)

(72) Inventor: Donald Siu, Santa Ana, CA (US)

(73) Assignee: PANASONIC AVIONICS CORPORATION, Lake Forest, CA (US)

( * ) Notice: Subject to any disclaimer, the term of this patent is extended or adjusted under 35 U.S.C. 154(b) by 324 days.

(21) Appl. No.: 14/923,261

(22) Filed: Oct. 26, 2015

(65) Prior Publication Data

US 2017/0117702 A1 Apr. 27, 2017

(51) Int. Cl.
*H02H 9/00* (2006.01)
*H05K 1/02* (2006.01)

(52) U.S. Cl.
CPC ................................. *H05K 1/0259* (2013.01)

(58) Field of Classification Search
CPC .................................................... H05K 1/0259
See application file for complete search history.

(56) References Cited

U.S. PATENT DOCUMENTS

| 2,427,460 | A | * | 9/1947 | Johnson | H01T 1/02 313/146 |
| 5,998,731 | A | * | 12/1999 | Takamura | H02G 13/00 174/3 |
| 7,442,045 | B1 | * | 10/2008 | Di Stefano | H01R 4/027 439/439 |
| 7,495,168 | B2 | * | 2/2009 | Park | H02G 13/00 174/2 |
| 7,576,414 | B2 | | 8/2009 | Huang et al. | |
| 2009/0195946 | A1 | | 8/2009 | Kleveland | |

* cited by examiner

*Primary Examiner* — Stephen W Jackson
(74) *Attorney, Agent, or Firm* — Vista IP Law Group LLP

(57) ABSTRACT

Systems and apparatus for controlling electrostatic discharge on an electronic circuit board. A voltage surge attractor comprises a cylindrical main body having a bottom end configured to be mounted to a substrate for an electronic circuit board and a top end. A cone portion comprising a conical frustum has a base disposed on the top end of the main body and the cone portion tapers upward from the base to a cone top. A cap extends upward from the cone top. The cap has one of spherical shape, a spheroidal shape or an ellipsoidal shape. An electronic device comprises a substrate having a plurality of electronic components mounted on the substrate and a chassis ground disposed on the substrate. One or more voltage surge attractors are mounted on the substrate in electrical connection to the chassis ground.

20 Claims, 3 Drawing Sheets

SYSTEMS AND APPARATUS FOR CONTROLLING ELECTROSTATIC DISCHARGE ON ELECTRONIC CIRCUIT BOARD

BACKGROUND

The field of the invention generally relates to electronic circuit boards, and more particularly, to systems and apparatus for controlling electrostatic discharge on electronic circuit boards.

Electronic systems generally utilize electronic devices such as circuit boards, including printed circuit boards (PCBs), to interconnect electronic components including, for example, semiconductors, microprocessors, resistors, transistors, diodes, lights, and various other electronic components. Many electronic components, including semiconductor devices like microprocessors and integrated circuits, are susceptible to being permanently damaged by electrostatic discharge (ESD) which can subject nearby objects to very high electrical voltage and current. Electrostatic discharge (ESD) is the sudden flow of electricity between two electrically charged objects caused by contact, an electrical short, or dielectric breakdown. A buildup of static electricity can be caused by tribocharging, or by electrostatic induction. Tribocharging is the build-up of static electric charges caused by friction between two materials. For instance, a human body can accumulate an electrostatic charge by walking on a rug, and rubber or plastic objects can build-up charges by rubbing them against a sweater or other types of fabric. The ESD occurs when the charged object contacts or comes sufficiently close to a differently charged object.

If a static charge discharges to an electronic device, the large voltage and current can permanently damage electronic components of the device. For instance, the voltage of an ESD is typically significantly higher than the breakdown voltage of many semiconductor devices like microprocessors and integrated circuits. If the semiconductor device is subjected to voltage exceeding the breakdown voltage, the semiconductor device is often permanently damaged and rendered inoperable.

Accordingly, a number of protective devices have been previously disclosed to protect electronic devices from being damaged by ESD. As an example, transient voltage suppression diodes (TVS diodes) have been utilized in the design and manufacture of electronic devices to protect the components from being damaged by ESD. The TVS diodes typically serve as parallel protection elements which divert transient current away from protected components in the event of an ESD. However, there are many different types of TVS diodes with different specifications, and they must be designed into the circuit design of the electronic devices.

SUMMARY

In one embodiment, the present invention is directed to a voltage surge attractor which can provide broad protection from ESD which is also generically applicable to electronic devices requiring protection from ESD, such as printed circuit boards and other electronic substrates for mounting electronics. The voltage surge attractor functions by attracting the voltage and current from an ESD away from the protected circuit and diverting the voltage and current to a ground plane connected to the voltage surge attractor.

The voltage surge attractor comprises a cylindrical main body. The main body has a bottom end configured to be mounted to a substrate for mounting electronics, such as a PCB, and a top end. The voltage surge attractor has a cone portion extending from the top end of the main body. The cone portion is in the shape of a conical frustum having a base and a cone top which is formed by removing the tip of a cone shape. The cone portion extends upward from the top end of the main body such that the base of the conical frustum is on the top end of the main body and the cone portion tapers upward from the base to a cone top. The voltage surge attractor further comprises a cap disposed on the cone top which extends upward from the cone top. The cap has a spherical, spheroidal or ellipsoidal shape, such that it provides omni-directional attraction to an ESD.

In another embodiment, the voltage surge attractor may further comprise a mounting seat for mounting the voltage surge attractor to a substrate. The mounting seat comprises a collar extending outward around the circumference of the main body near the bottom end of the main body.

In still another embodiment, the main body, cone portion and cap are formed as a single, integral structure. While in another embodiment, the main body, cone portion and cap may be separate parts which are attached together to form the voltage surge attractor.

In yet another embodiment, the parts of the voltage surge attractor, including the main body, cone portion and cap, are made of a metal and are plated with gold plating.

In another embodiment, the present invention is directed to an electronic device having a plurality of electronic components, in combination with the voltage surge attractor, as described above. The electronic device comprises a substrate having a plurality of electronic components and conductive traces disposed on the substrate. A chassis ground is disposed on the substrate and forms a chassis ground plane. The bottom end of a surge attractor, as described above, is mounted on the substrate in electrical connection to the chassis ground trace, with the main body extending away from the substrate. The voltage surge attractor may be any of the embodiments of surge attractors as described herein.

In another embodiment, the electronic device of the present invention may include a substrate having a plurality of layers, including a top layer, and one or more lower layers. The chassis ground is disposed on the top layer. The voltage surge attractor is mounted on the top layer. The top layer and the one or more lower layers each have a plurality of vias which electrically connect each layer to the chassis ground.

In another embodiment, the electronic device may comprise a plurality of the voltage surge attractors mounted on the substrate in spaced apart relation. The bottom end of each of the voltage surge attractors is mounted on the substrate in electrical connection to the chassis ground trace with each respective main body extending away from the substrate.

In still another embodiment of the present invention, the chassis ground of an electronic device is configured to completely encloses a perimeter of a surface of the substrate and an isolated ground is disposed on the surface of the substrate within the area enclosed by the chassis ground such that the isolated ground is electrically isolated from the chassis ground.

DETAILED DESCRIPTION

The present invention is directed to systems and apparatus for controlling electrostatic discharge on electronic circuit boards having a substrate for mounting electronic components, such as PCBs which have a substrate for mounting electronic components and conductive traces for electrically connecting the components.

Figure 1:
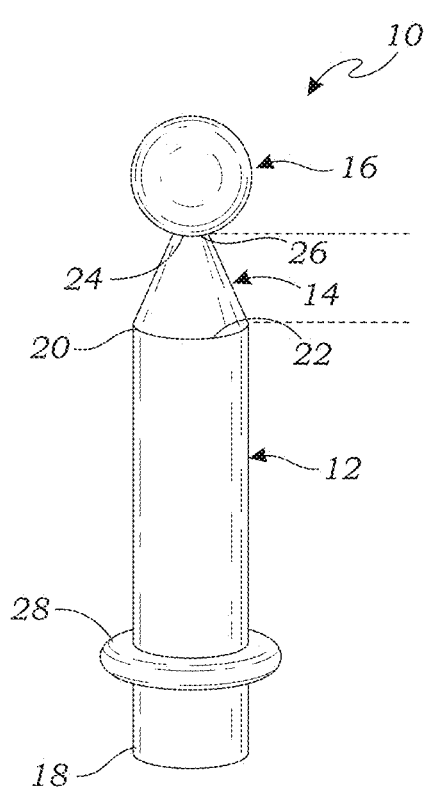
FIG. 1 is a perspective view of a voltage surge attractor, according to one embodiment of the present invention.
Figure 2:
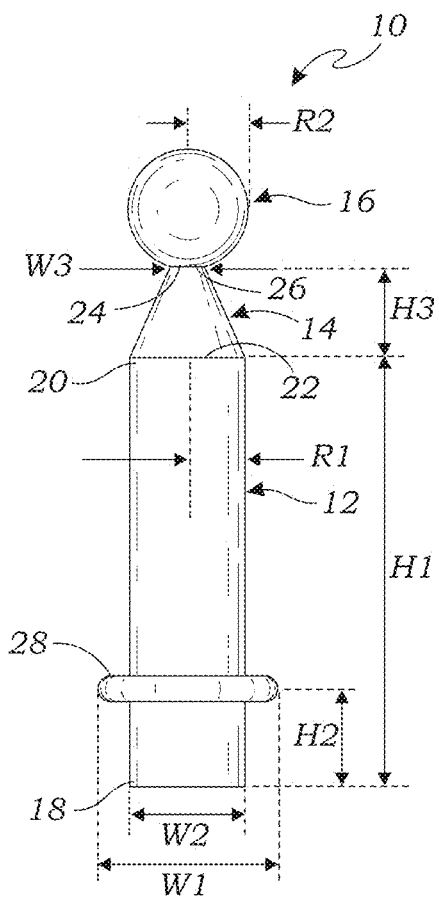
FIG. 2 is side view of the voltage surge attractor of FIG. 1, according to one embodiment of the present invention.

Referring to FIGS. 1 and 2, a voltage surge attractor 10 for controlling electrostatic discharge and protecting nearby, sensitive electronics is shown. The voltage surge attractor 10 is configured to attract the voltage and current from an ESD away from the protected circuit and to divert the voltage and current to a ground plane connected to the voltage surge attractor 10. The voltage surge attractor 10 comprises a cylindrical main body 12, a cone portion 14 and a cap 16. The main body 12 is an elongated cylinder having a bottom end 18 configured to be mounted to a substrate for mounting electronics and a top end 20. In alternative embodiments, the surge attractor 10 may include only the main body 12 and cap 16. In yet other alternative embodiments, the main body 12 may not be cylindrical and simply be an elongated portion supporting a cap 16 at one end or an elongated portion having an enlarged distal end for functioning as a cap.

The cone portion 14 extends from the top end 20 of the main body 12. The cone portion 14 has the shape of a conical frustum having a base 22 and a cone top 24. The cone top 24 is formed with the tip of a cone shape removed. The cone portion 14 extends upward from the top end 20 of the main body 12 with the base 22 of the conical frustum on the top end 20 of the main body 12 and the cone portion 14 tapering upward from the base 22 to the cone top 24.

The cap 16 of the voltage surge attractor 10 has a substantially spherical shape. In alternative embodiments, the cap 16 may have a substantially spheroidal or ellipsoidal shape. The cap 16 has a cap base 26 which interfaces (e.g., connects) with the cone top 24 such that the cap 16 extends upward from the cap base 26 and the cone top 24. The spherical shape of the cap 16 assists in providing an omnidirectional attraction of an ESD to the voltage surge attractor 10.

The main body 12 also comprises a mounting seat 28 comprising a collar which extends outward around the circumference of the main body 12 near the bottom end 18 of the main body 12. The mounting seat 28 facilitates mounting the voltage surge attractor 10 to a substrate by inserting the bottom end 18 of the main body 12 into a hole in a substrate such that the mounting seat 28 sits on the surface of the substrate. For example, the mounting seat 28 may contact a chassis ground trace disposed on the surface of the substrate around the hole in the substrate in which the bottom end 18 of the main body 12 is inserted.

The main body 12, cone portion 14 and cap 16 may be formed as a single, integral structure, or they may be may formed as separate parts which are attached together to form the voltage surge attractor 10. The main body 12, cone portion 14 and cap 16 are preferably made of a metal which is electrically conductive. In addition, the parts of the voltage surge attractor 10, including the main body 12, cone portion 14 and cap 16, may be plated with a metal or metal alloy, such as gold, gold alloys, silver, silver alloys, copper, copper alloys, etc.

The voltage surge attractor 10 is placed in the vicinity of sensitive electronics to protect the electronics from an ESD. In many cases, a plurality of voltage surge attractors 10 are placed in spaced apart location around the perimeter of the sensitive electronics. The voltage surge attractor 10 is positioned with the cap 16 extending upward or away from the platform or substrate upon which the sensitive electronics are mounted. Each of the voltage surge attractors 10 is electrically connected to a chassis ground. In the event of an ESD, the discharge is directed primarily through the voltage surge attractor(s) 10 as the voltage surge attractor(s) 10 are the nearest and lowest impedance path to the chassis ground, as described in further detail below.

Referring to FIG. 2, the voltage surge attractor 10 and its components may be of any suitable size, including the following suggested dimensions:

$(H1-H2)+H3+2R2=10$ mm $W2=2R2 \geq 1.5$ mm.

$W1 \geq 1.15 \times W2$.

$H2 \geq 1.15 \times$ thickness of the substrate thickness (e.g., top substrate 32, described below).

The radius R2 may be equal to the radius R1. The distance from a top of the substrate (such as top substrate 32, described below) to a top cover (not shown) for an electronic circuit board may be about 20 mm. In such case, the distance from the mounting seat 28 to the top of the cap 16 (i.e., the overall mounted height of the surge attractor 10) may be about half the distance to the top cover (about 10 mm, as set forth the above: $(H1-H2)+H3+2R2=10$ mm). In other words, the distance from the top of the substrate to the top cover may be about twice the mounted height of the surge attractor 10.

Figure 3:
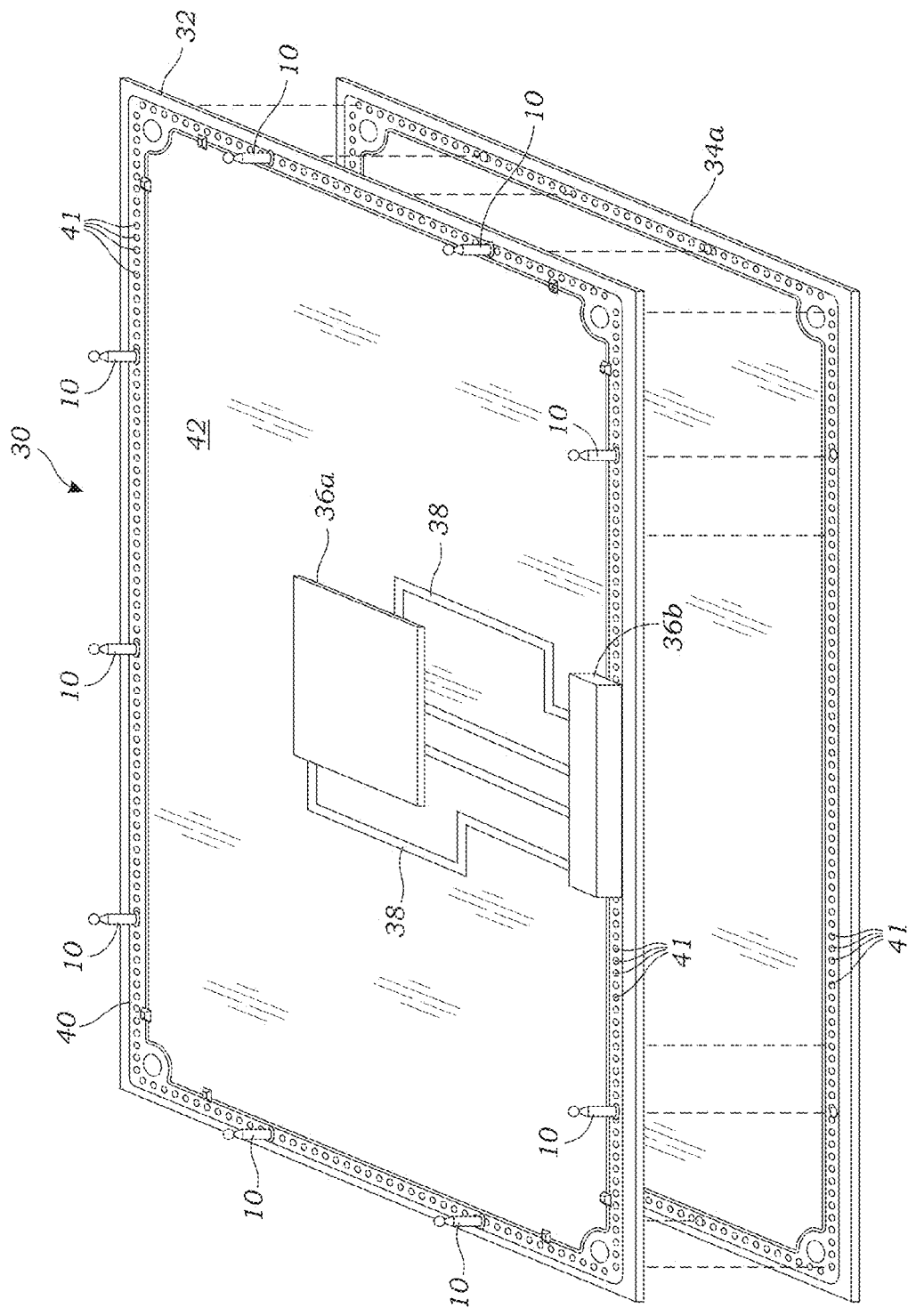
FIG. 3 is a perspective view of an electronic device having a voltage surge attractor, according to one embodiment of the present invention.
Figure 4:
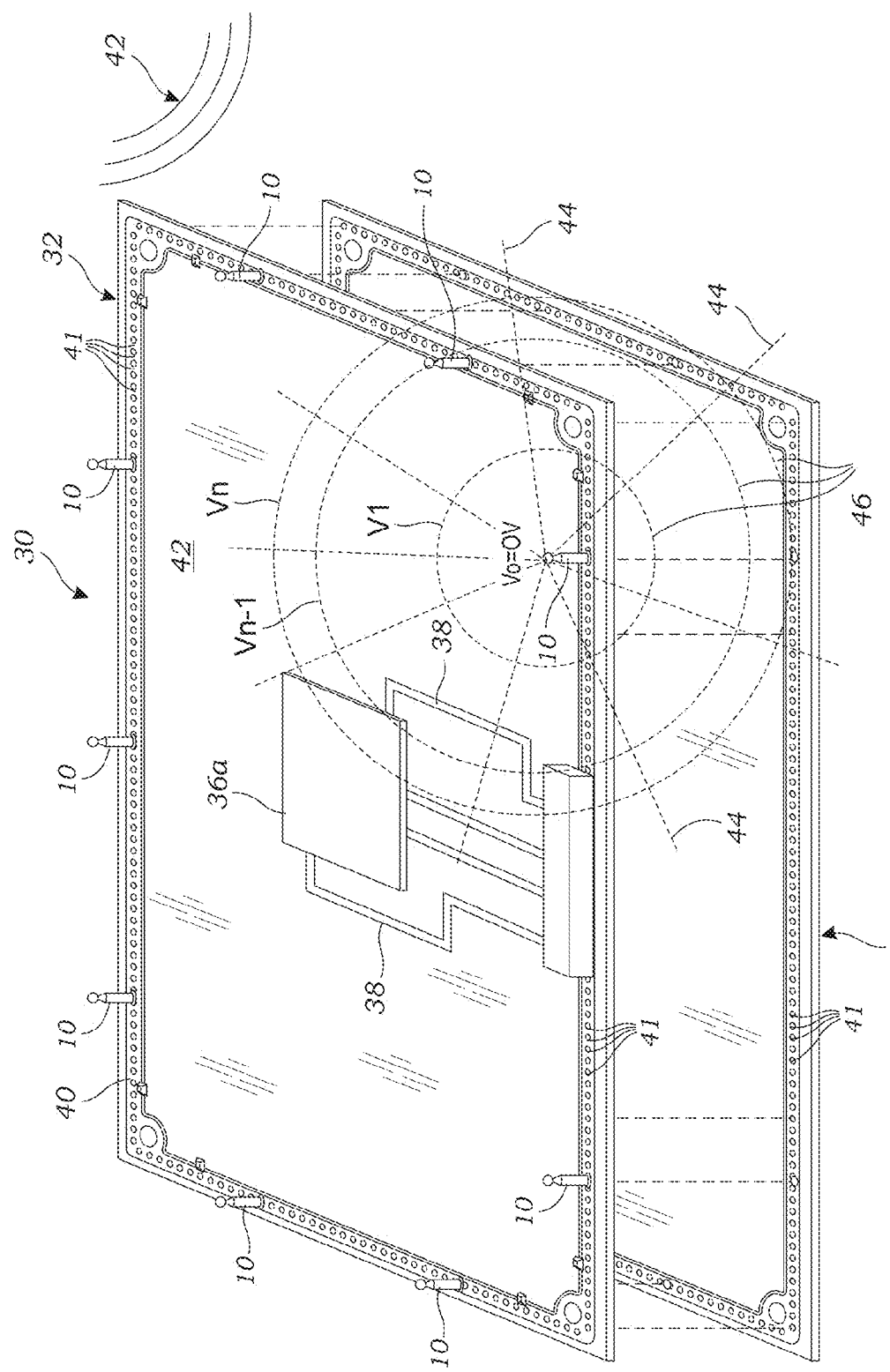
FIG. 4 is a perspective view of the electronic device having a voltage surge of FIG. 3 which also shows electric field lines, equipotential lines and a simulated high voltage discharge from an ESD, according to one embodiment of the present invention.

Turning now to FIGS. 3 and 4, an electronic device 30 which utilizes the voltage surge attractor 10 is shown. The electronic device 30 includes a top substrate 32, and one or more lower substrates 34 below the top substrate 32. The lower substrates 34 include a bottom substrate 34a which is the bottom-most lower substrate. Each of the substrates 32 and 34 has a plurality of electronic components 36 and conductive traces 38. For instance, the electronic component 36a may be an integrated circuit such as a microprocessor. The electronic component 36b may be a connector for connecting the electronic device 30 to other components of a device.

A chassis ground 40 comprising a conductive trace is disposed on a surface of the top substrate 32. The chassis ground 40 is configured to be electrically connected to a metal chassis enclosure (not shown) for enclosing the electronic device 30. The chassis ground 40 may enclose the entire perimeter of the top substrate 32, as shown in FIGS. 3 and 4. Alternatively, the chassis ground 40 may enclose one or more sensitive electronic components which are intended to be protected from ESD. Thus, the chassis ground 40 forms a chassis ground plane. For electronic components that do not require chassis ground isolation, an analog/digital ground plane may be merged with the chassis ground plane to form one solid ground plane that also protects such electronic components from ESD the same as the isolated electronic components. The chassis ground 40 is designed to provide the lowest impedance as compared with the analog/digital ground and other circuits. The conductive trace forming the chassis ground 40 may be about 3 mm wide, or from about 1-5 mm wide, or from about 2-4 mm wide, on all of the layers including the top substrate 32 and each of the lower substrates 34. The preferred width depends on the configuration of the electronic device 30, such as the size and spacing of the substrates 32 and 34, the location of the ESD-sensitive electronic components 36, and other considerations.

The top substrate 32 is connected through all of the lower substrates 34, including the bottom substrate 34a, using plate-through-hole vias 41. The vias 41 are spaced around the perimeter of each of the substrates 32 and 34 to enclose the respective electronic components 36 on each of substrates 32 and 34. The vias 41 may be spaced 3 mm apart, or between about 1-5 mm apart, or between about 2-4 mm apart, around the perimeter of the substrates 32 and 34. The preferred spacing of the vias 41 also depends on the configuration of the electronic device 30, such as the size and spacing of the substrates 32 and 34, the location of the ESD sensitive electronic components 36, and other considerations.

A plurality of voltage surge attractors 10, as described herein, are mounted on the top substrate 32 spaced apart around the perimeter of the top substrate 32. The bottom end 18 of each of the voltage surge attractors 10 is inserted into a respective hole in the top substrate 32 such that the mounting seat 28 is in electrical contact with the chassis ground 40. Each of the voltage surge attractors 10 is mounted on the top substrate 32 with the main body 12 extending upward away from the top surface of the substrate 32. The voltage surge attractors 10 may be located not only around the perimeter of the top substrate 32, but also may be located near ESD-sensitive electronic components which need to be protected from ESD, especially when the top substrate 32 is large compared to the height of the voltage surge attractors 10 above the top substrate 32 (height voltage surge attractor $10=(H1-H2)+H3+2R2$, as shown in FIG. 2), such as when the top substrate is longer or wider than about 10-20 times the height.

With reference to FIG. 4, the protective function of the electronic device 30 against ESD will be described. As high voltage 42 from an ESD approaches the electronic device 30, such as through ventilation holes or air gaps, it tends to dissipate its energy to the nearest and lowest ground potential. Accordingly, the chassis ground 40 and voltage surge attractors 10 guide the high voltage 42 along the electric field lines 44, as depicted in FIG. 4, to safely dissipate the high voltage energy into the chassis ground 40 and then to the metal chassis enclosure (not shown). The electric field lines 44 are three-dimensional lines emanating from the high voltage ESD source 42. Along these electric field lines 44, there are equipotential lines 46 that are perpendicular to the electric field lines 44. All voltages on the equipotential lines 46 are equal in amplitude. Thus, the high voltage 42 from the ESD discharges continuously from the highest potential Vn to the lowest potential Vo. Since the entry point of the high voltage 42 can be anywhere in a three-dimensional space, the perimeter stitching of the interconnected vias 41 of the substrate layers 32 and 34, in the case of side entry, provide protection to the electronic components 36 on the lower substrates 34. The interconnected through-hole vias 41 provide a dense conducting mesh that completely encloses the entire perimeter of each of the lower substrates 34 thereby protecting all of the inner-layer circuit traces and electronic components 36 from being damaged by the ESD. In the case of entry from the top of the electronic device 30, the voltage surge attractors 10 provide the nearest and lowest impedance path to the chassis ground 40. Accordingly, the high voltage 42 from the ESD is attracted to the voltage surge attractors 10 instead of the circuit traces 38 and electronic components 36 on the top substrate 32. The voltage surge attractors 10 then safely conduct the high voltage 42 to the chassis ground 40 which dissipates the high voltage 42 to the metal chassis enclosure. Other entry points for the high voltage 42 from an ESD, such as substrate 32 to substrate 34 connecting wires, and substrate 32 or 34 to external devices connecting wires, may require ESD suppression components for added protection.

Although particular embodiments have been shown and described, it is to be understood that the above description is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims. For example, not all of the components described in the embodiments are necessary, and the invention may include any suitable combinations of the described components, and the general shapes and relative sizes of the components of the invention may be modified. Accordingly, embodiments are intended to exemplify alternatives, modifications, and equivalents that may fall within the scope of the claims. The invention, therefore, should not be limited, except to the following claims, and their equivalents.

What is claimed is:

1. A voltage surge attractor, comprising:
   a cylindrical main body having a bottom end configured to be mounted to a substrate for mounting electronics and a top end;
   a cone portion in the shape of a conical frustum, the cone portion extending from the top end of the main body in which a base of the cone portion is on the top end of the main body and the cone portion tapers upward from the base to a cone top; and
   a cap extending upward from the cone top, the cap having one of a spherical shape, a spheroidal shape, or an ellipsoidal shape.

2. The voltage surge attractor of claim 1, further comprising:
   a mounting seat comprising a collar extending outward around the circumference of the main body near the bottom end of the main body.

3. The voltage surge attractor of claim 1, wherein the main body, cone portion and cap are formed as a single, integral structure.

4. The voltage surge attractor of claim 1, wherein the main body, cone portion and cap are separate parts which are attached together.

5. The voltage surge attractor of claim 1, wherein the main body, cone portion and cap are made of a metal and covered with gold plating.

6. The voltage surge attractor of claim 1, further comprising:
   a mounting seat comprising a collar extending outward around the circumference of the main body near the bottom end of the main body; and wherein
   the main body, cone portion and cap are formed as a single, integral structure; and
   the main body, cone portion and cap are made of a metal and coated with gold plating.

7. An electronic device, comprising:
a substrate having a plurality of electronic components and conductive traces disposed on the substrate;
a chassis ground disposed on the substrate and forming a chassis ground plane; and
a voltage surge attractor comprising:
- a cylindrical main body having a bottom end configured to be mounted to a printed circuit board and a top end;
- a cone portion in the shape of a conical frustum, the cone portion extending from the top end of the main body in which a base of the cone portion is on the top end of the main body and the cone portion tapers upward from base to a cone top; and
- a cap extending upward from the cone top, the cap having one of a spherical shape, a spheroidal shape, or an ellipsoidal shape;
wherein the bottom end of the voltage surge attractor is mounted on the substrate in electrical connection to the chassis ground plane, and the main body extends away from the substrate.

8. The electronic device of claim 7, wherein:
the substrate comprises a plurality of layers, including a top layer, and one or more lower layers;
the chassis ground is disposed on the top layer;
the voltage surge attractor is mounted on the top layer; and
the top layer and the one or more lower layers each have a plurality of vias which electrically connect each layer to the chassis ground.

9. The electronic device of claim 7, further comprising:
a plurality of the voltage surge attractors mounted on the substrate in spaced apart relation, wherein a bottom end of each of the voltage surge attractors is mounted on the substrate in electrical connection to the chassis ground trace with each respective main body extending away from the substrate.

10. The electronic device of claim 7, wherein:
the chassis ground completely encloses a perimeter of a surface of the substrate; and
an isolated ground is disposed on the surface of the substrate within an area enclosed by the chassis ground, the isolated ground electrically isolated from the chassis ground.

11. The electronic device of claim 7, wherein the voltage surge attractor further comprises a mounting seat comprising a collar extending outward around the circumference of the main body near the bottom end of the main body.

12. The electronic device of claim 7, wherein the main body, cone portion and cap of the voltage surge attractor are formed as a single, integral structure.

13. The electronic device of claim 7, wherein the main body, cone portion and cap of the voltage surge attractor are separate parts which are attached together.

14. The electronic device of claim 7, wherein the main body, cone portion and cap of the voltage surge attractor are made of a metal and plated with gold.

15. The electronic device of claim 7, wherein:
the voltage surge attractor further comprises a mounting seat comprising a collar extending outward around the circumference of the main body near the bottom end of the main body;
the main body, cone portion and cap are formed as a single, integral structure; and
the main body, cone portion and cap are made of a metal and covered with gold plating.

16. An electronic device, comprising:
a substrate having a plurality of electronic components and conductive traces disposed on the substrate, the substrate comprising a plurality of layers including a top layer and one or more lower layers, the top layer and one or more lower layers each having a plurality of vias which electrically connect each layer to the chassis ground;
a chassis ground disposed on the top layer of the substrate and forming a chassis ground plane; and
a plurality of voltage surge attractors mounted on the top layer of the substrate in spaced apart relation and in electrical connection to the chassis ground, each voltage surge attractor comprising:
- an elongated main body having a bottom end configured to be mounted to a printed circuit board and a top end;
- a cap extending upward from the top end, the cap having one of a spherical shape, a spheroidal shape, or an ellipsoidal shape; and
the bottom end of each voltage surge attractor mounted on the substrate to the chassis ground with the respective main body extending away from the substrate.

17. The electronic device of claim 16, wherein:
the chassis ground completely encloses a perimeter of the substrate; and
an isolated ground is disposed on the substrate within an area enclosed by the chassis ground, the isolated ground electrically isolated from the chassis ground.

18. The electronic device of claim 16, wherein the voltage surge attractor further comprises a mounting seat comprising a collar extending outward around the circumference of the main body near the bottom end of the main body.

19. The electronic device of claim 16, wherein the main body, cone portion and cap of each voltage surge attractor are formed as a single, integral structure.

20. The electronic device of claim 16, wherein the main body and cap of each voltage surge attractor are separate parts attached together to form each of the respective voltage surge attractors.

* * * * *